(12) United States Patent
Matsushita et al.

(10) Patent No.: US 6,818,820 B2
(45) Date of Patent: Nov. 16, 2004

(54) SOLAR CELL STRUCTURAL BODY, SOLAR CELL ARRAY AND SUNLIGHT POWER GENERATION SYSTEM

(75) Inventors: Masaaki Matsushita, Nara (JP); Akiharu Takabayashi, Nara (JP); Hidehisa Makita, Kyoto (JP); Takaaki Mukai, Nara (JP); Shigenori Itoyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/158,848

(22) Filed: Jun. 3, 2002

(65) Prior Publication Data

US 2003/0000566 A1 Jan. 2, 2003

(30) Foreign Application Priority Data

Jun. 1, 2001 (JP) ........................ 2001-167332

(51) Int. Cl.[7] ..................... H01L 31/048; H01L 31/042
(52) U.S. Cl. ....................... 136/251; 136/244; 136/291; 136/256; 52/173.3; 62/648.1
(58) Field of Search ................. 136/244, 251, 136/291, 256; 52/173.3; 60/641.8, 648.1

(56) References Cited

U.S. PATENT DOCUMENTS

| | | | | |
|---|---|---|---|---|
| 5,415,700 A | * | 5/1995 | Arthur et al. | 136/250 |
| 2001/0008143 A1 | * | 7/2001 | SaSaoka et al. | 136/244 |
| 2002/0162484 A1 | * | 11/2002 | Ramme et al. | 106/705 |
| 2002/0195136 A1 | * | 12/2002 | Takabayashi et al. | 136/244 |
| 2002/0195138 A1 | * | 12/2002 | Itoyama et al. | 136/251 |
| 2003/0075211 A1 | * | 4/2003 | Makita et al. | 136/244 |

FOREIGN PATENT DOCUMENTS

| | | | |
|---|---|---|---|
| JP | 5-3430 | | 1/1993 |
| JP | 8-120827 A | * | 5/1996 |
| JP | 8-239948 A | * | 9/1996 |
| JP | 11-270023 A | * | 10/1999 |
| JP | 2001-60704 | | 3/2001 |
| WO | WO-97/15953 A1 | * | 5/1997 |

OTHER PUBLICATIONS

Popoola et al, "Microstructural and Microchemical Characterization of a Calcium Aluminate–Polymer Composite (MDF Cement)," J. Am. Chem. Soc. 74(8), pp. 1928–1933, (1991).*

* cited by examiner

*Primary Examiner*—Alan Diamond
(74) *Attorney, Agent, or Firm*—Fitzpatrick, Cella, Harper & Scinto

(57) ABSTRACT

A solar cell structural body having a solar cell arranged on a concrete retaining body comprising a concrete prepared from a mixture comprising at least a cement, water and an aggregate, such that part of a conductor portion of the solar cell contacts the concrete retaining body. The concrete has a resistivity in a range of from $9\times10^3$ to $120\times10^3$ $\Omega\cdot cm$. A solar cell array in which the solar cell structural body is used, and a sunlight power generation system in which the solar cell structural body is used.

12 Claims, 10 Drawing Sheets

F I G. 3
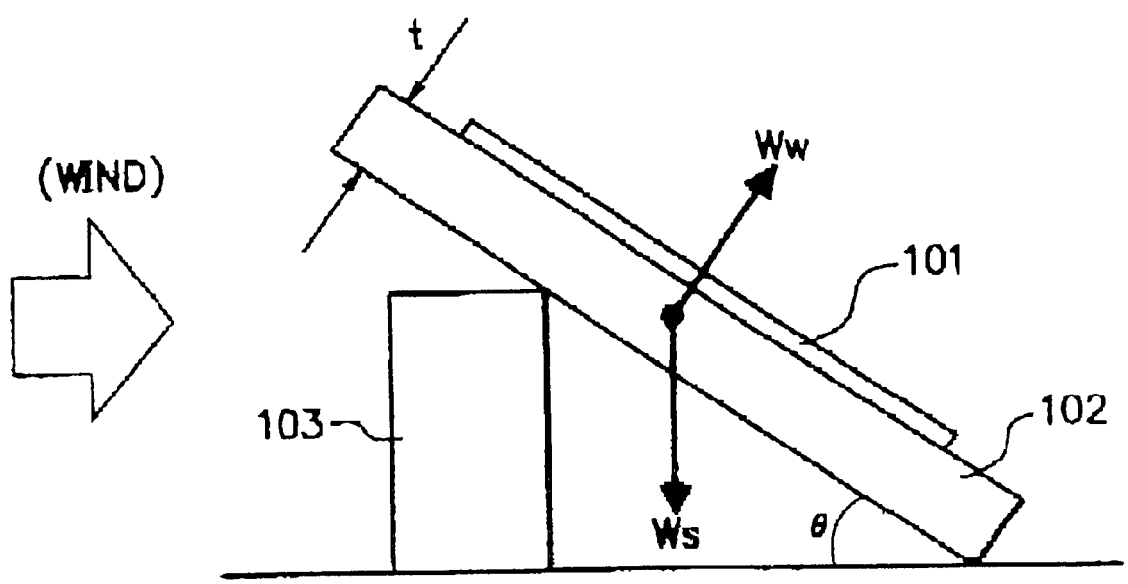

F I G. 4
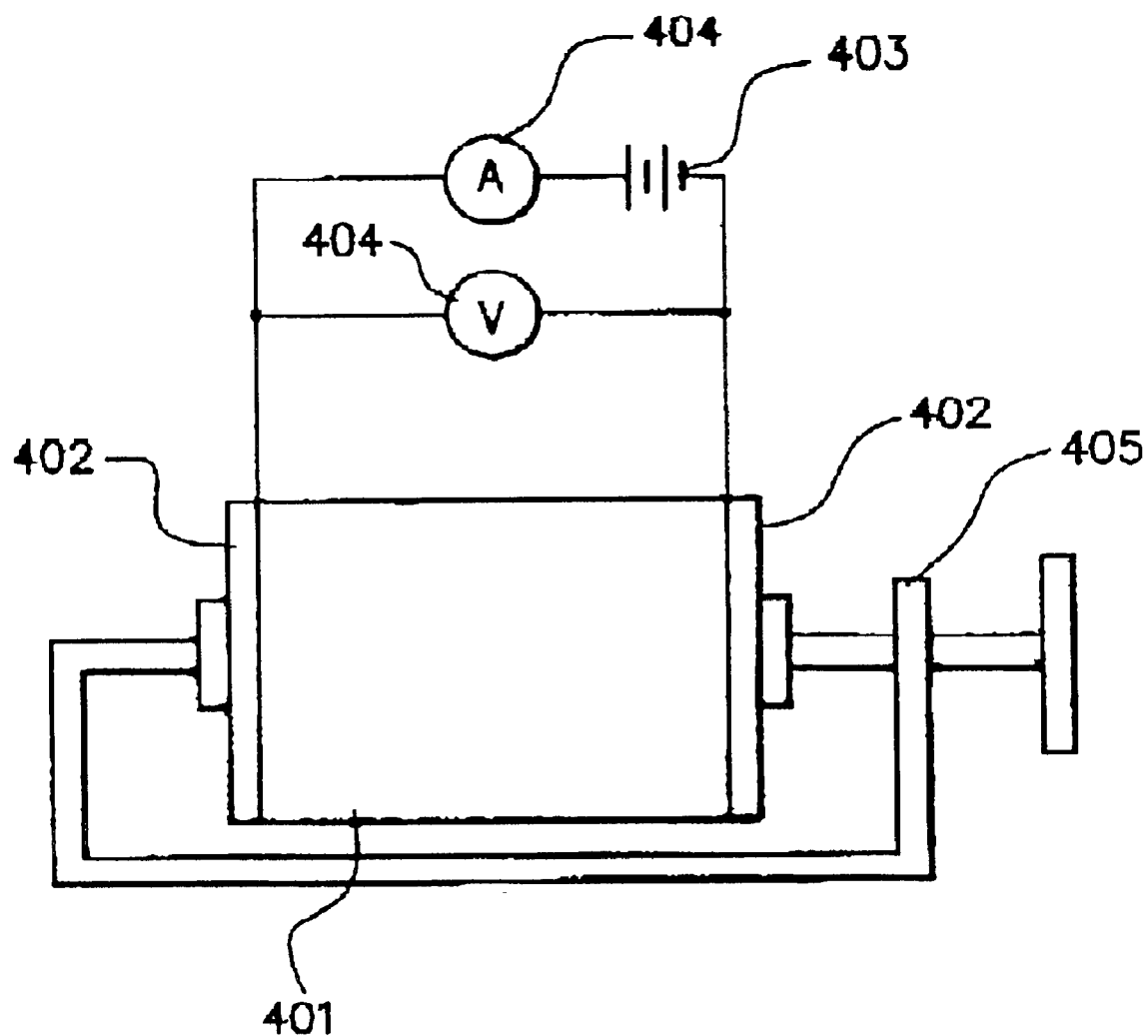

F I G. 6
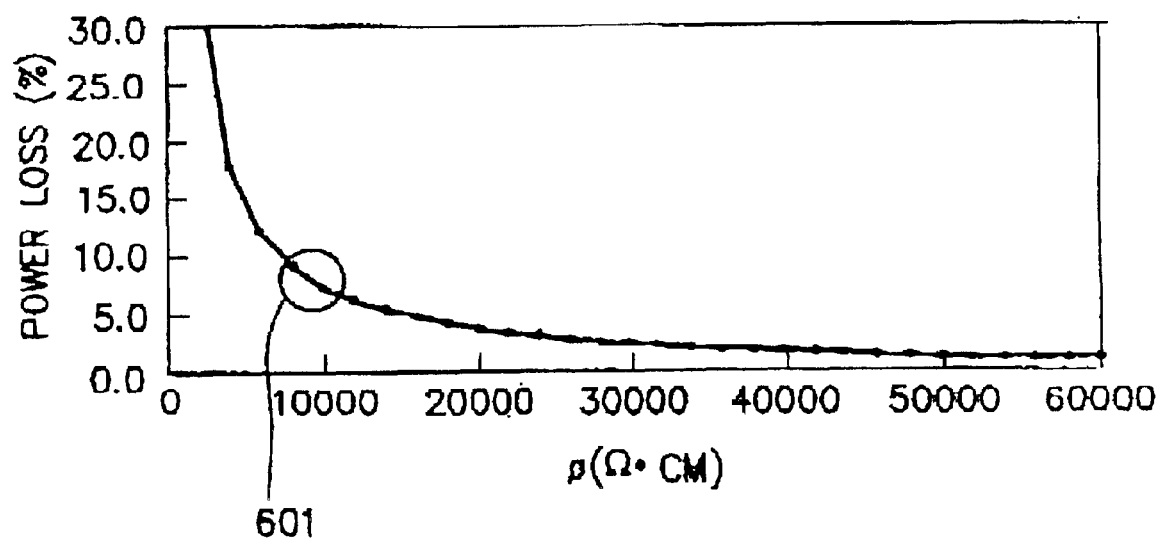

F I G. 9
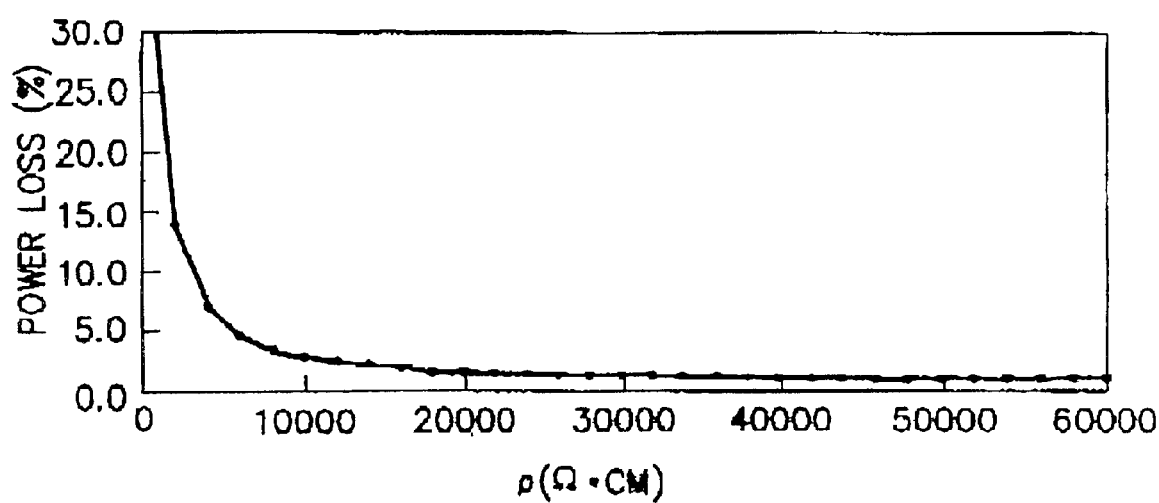

F I G. 10
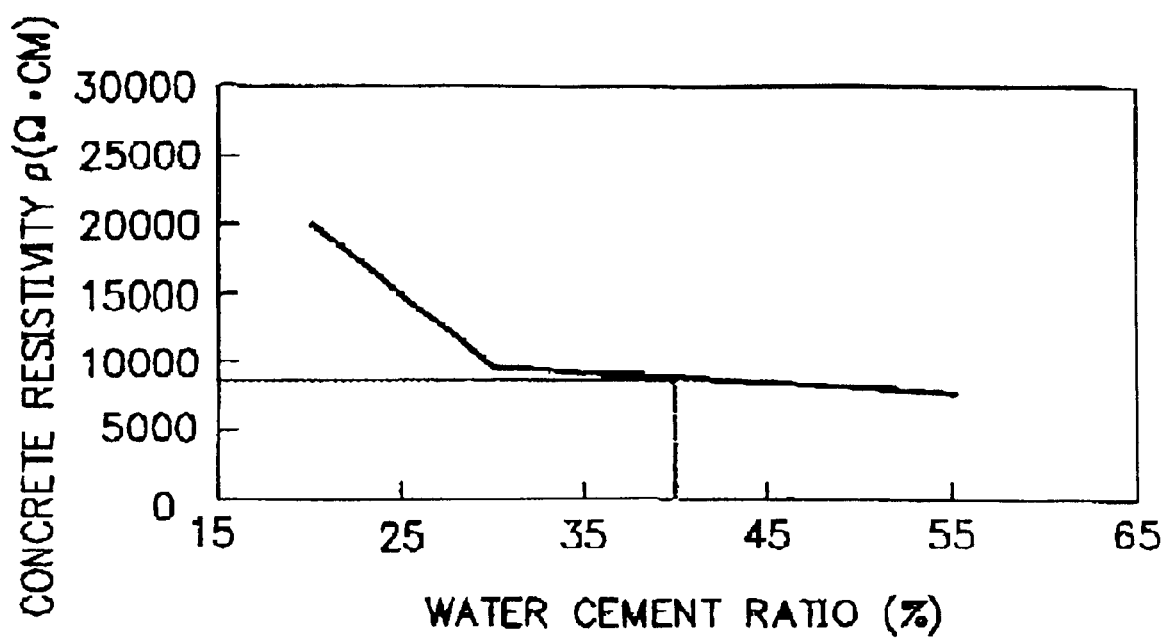

SOLAR CELL STRUCTURAL BODY, SOLAR CELL ARRAY AND SUNLIGHT POWER GENERATION SYSTEM

BACKGROUND OF THE INVENTION

1. Field of the Invention

The present invention relates to a solar cell structural body comprising a solar cell and a concrete member, particularly a solar cell structural body comprising a solar cell arranged on a concrete retaining body such that part of a conductor portion of said solar cell is contacted with said concrete retaining body a solar cell array and a sunlight power generation system in which said solar cell structural body is used. The term "conductor portion" in the present invention means an exposed conductor portion extending from the electrode of the solar cell.

2. Related Background Art

In recent years, societal consciousness of the problems relating to the environment and energy has been increasing all over the world. Particularly, the earth warming because of the so-called greenhouse effect due to an increase of atmospheric $CO_2$ has been predicted to cause a serious problem. In view of this, public attention has been focused on a sunlight power generation system (that is, a solar cell power generation system) for the reason that it is a clean power generation system which generates electric power using sunlight, which is evenly accessible at any place In the world, as the power generation energy source, and which can attain relatively high power generation efficiency without necessity of using a complicated large installation.

Presently, as such sunlight power generation system, a variety of solar cell modules have been used at certain private residential buildings and at certain public facilities and also for portable appliances. However, such solar cell modules are still expensive. This situation has presented a major obstacle in making the use of solar cell modules more widespread not only at private residential buildings but also at public facilities.

As one of the measures to overcome this obstacle, there can be mentioned a manner of integrating a solar cell module with a relatively inexpensive product in a different industrial field to diminish the total cost. As a typical example of a solar cell module of the type installed on a building structural body, there can be mentioned a trestle installation type solar cell module comprising a framed solar cell module installed on a trestle provided on a roof and a building material integral type solar cell module comprising a solar cell module integrated with a building material. These solar cell modules presently have been spotlighted for the reasons that the material cost can be diminished because a roofing material as a separate member is not required to be used and the construction cost upon the installation can be diminished because they can be installed in the same manner as in the ordinary roof installation, where the solar cell modules can be installed on a roof of a building at a relatively low cost in terms of the total cost. In addition, the roof installed with any of these solar cell modules has a beautiful exterior appearance which is in harmony with surrounding roofs.

Solar cell modules in recent years which are represented by aforementioned solar cell modules are of value-added types integrated with products in various industrial fields. To be more specific, these solar cell modules share the material costs and the production costs of the two members, and when the shared costs are considered as the total cost, it can be said that the total cost is markedly reduced.

Separately, for the sunlight power generation system, it is expected to be used at power generation facilities in the near future as a new energy source to replace the present energy source.

Incidentally, in order to comply with the consumption of power which has been continuously increasing year by year, power generation facilities have been newly established in recent years. Particularly, the consumption of power becomes significant during day time, when people work in the offices and the like, where it often reaches a peak mainly due to a significant increase in the energy consumed in operating the equipment used for office work and the like. In addition, especially during summer time, the consumption of power frequently reaches a peak due to a marked increase in the energy consumed in operating cooling systems. This phenomenon of reaching a peak in terms of the consumption of power is generally called an energy peak.

Now, the power generation facilities newly established up to the present time include thermal power stations, hydraulic power stations, atomic power stations and the like. However, in recent years, in the light of prevention of the earth warming, environmental protection and the like, sunlight power generation, wind power generation, geothermal power generation and the like have been spotlighted.

The peak energy time zone in summer time or day time is a time zone when sunlight is irradiated. Thus, public attention is focused on a sunlight power generation plant where a sunlight power generation system having a performance capable of generating a large energy (power) in the peak energy time zone is used as the power source.

However, in the case where a solar cell module is used as the sunlight power generation system as the power source in the sunlight power generation plant, the power generation cost (the cost of the power generated) becomes very high as long as an ordinary solar cell module is used as said solar cell module. In order to improve this situation, it is considered to be effective to adopt the foregoing manner in that a solar cell module is integrated with a relatively inexpensive product in a different industrial field so as to share the material costs and the production costs of the two members, whereby the total cost is reduced.

However, when such a solar cell module is used as the power source in a sunlight power generation plant, the essential function is to generate power and other functions are not necessitated necessary. To be more specific, for use together with the power source in a thermal power station or the like, it is a very important factor to use not such value-added solar cell module but a relevant solar cell module which is the same as the power source in the thermal power station or the like in terms of the power generation cost. In light of prevention of global warming, environmental protection and the like, it is ideal to use only a relevant sunlight power generation system which provides clean energy. However, since the sunlight power generation system is excessively costly, it is almost impossible that the new power source replaces the conventional power source.

To be more specific, any of the presently available solar cell modules which are costly in terms of the cost of the power generated is very difficult to use as the power source in the power plant.

The foregoing power generation cost is obtained from the equation: power generation cost=[(annual apparatus cost)+(annual repair cost+annual maintenance cost)+(annual fuel cost)]/(annual generated power quantity). The annual apparatus cost here means a cost obtained by dividing the total construction expense (the total initial investment amount) by the service life year of the power generation system. However, in this case, the interests must be taken into consideration. The "annual repair cost+annual maintenance cost" means the sum of the annual expenses required for the maintenance of the power generation system. The annual fuel cost means the sum of the annual expenses required for the fuel necessary to operate the power generation system.

In the case of a sunlight power generation system in which a solar cell module is used, unlimited solar energy which is evenly accessible at any place in the world is used in order to generate electric power and therefore, the above-mentioned annual fuel cost is not necessitated. In addition, the "annual repair cost+annual maintenance cost" does not become considerable. A main factor to increase the power generation cost in the case of the sunlight power generation system is the annual apparatus cost, where the watt cost of the solar cell module is considerable.

Under such circumstance, in order to make the use of the sunlight generation system to be more widely spread and in order to make the sunlight generation system capable of being used as the power source in the power generation station, it is essential to greatly reduce the power generation cost. To be more specific, it is essential that the watt cost of the solar cell module and the apparatus cost are reduced so that the power generation cost is competitive with that in any of the current power generation systems.

In the following, description will be made of the foregoing cost relating to the solar cell module.

In the case of a sunlight power generation system in which a solar cell module, the system is designed on the assumption that ordinary people who are not acquainted with electric things including solar cells will use and touch the system. For doing in this way, a number of materials are necessary to be used in order to enhance the security and because of this, the material cost is unavoidably increased. In addition, thermocompression process is required to perform in the production of the solar cell module, where the man-hour becomes considerable and the productivity is reduced. Thus, the production cost of the solar cell module is eventually raised. That is, the power generation cost as a whole is raised. As long as the solar cell module is produced in this way, there is a limit for reducing the watt cost of the solar cell module.

In the case of a solar cell module used in the power generation station, the solar cell module is used under controlled environment. The controlled environment here means a location where only specialists (handling persons) who are acquainted with electric things including solar cells are admitted to enter therein but any other persons are prohibited from entering therein. In order to establish such controlled atmosphere, it takes a measure such that a fence or a wall is provided around an external enclosure for the solar cell module or/and a key is provided at the entrance of the location where the solar cell module is present. And the controlled atmosphere is made so that the handling persons can perform periodical maintenance works for the solar cell module. Because the solar cell module is used under such controlled environment, the specification relating to the safety and insulation of the solar cell module can be mitigated.

For the installation method of the solar cell module, there are known a method wherein a frame body is provided at a solar cell module and the frame body is installed on a trestle and a method wherein a steel plate is provided at the back face side of a solar cell module and the steel plate is processed, followed by being installed on a trestle. However these methods have disadvantages such that a number of materials are required to be used, along with this the number of operations is increased, and as a result, the installation cost is raised.

In order to diminish the installation cost, there are various proposals of a method wherein a solar cell module is provided at a relatively inexpensive concrete member capable of being used as a back face member or a trestle for the solar cell module.

Particularly, Japanese Laid-open Patent Publication No. 11(1999)-270023 (hereinafter referred to as document 1) discloses a wall panel (a panel for a wall) which comprises a panel main body comprising a light weight foamed concrete member provided with a recessed portion having a prescribed depth at the surface thereon and a solar cell module embedded in said recessed portion. Document 1 describes that because the solar cell module is installed in the recessed portion of the concrete member so as to integrate with the panel main body, not only the execution work efficiency but also the maintenance work efficiency are improved.

Japanese Laid-open Patent Publication No. 2001-60704 (hereinafter referred to as document 2) discloses a photoelectric conversion apparatus comprising a first electrode layer, a semiconductor layer and a second electrode layer sequentially stacked in this order on a substrate, and a sealing resin film disposed to cover the surface of the second electrode layer, wherein a temporary peeling film is clad on the sealing resin film through an adhesive layer such that the temporary peeling film is capable of being peeled, and wherein the adhesive layer, after the temporary peeling film is peeled, provides a sticky face for a member on which the photoelectric conversion apparatus is mounted. In document 2, there are illustrated a concrete plate, a slate plate, a roof tile, a metal plate, and the like. Document 2 describes that because of using the temporary peeling film, not only the execution work efficiency but also the maintenance work efficiency are improved.

Japanese Laid-open Utility Model Publication No. 5(1993)-3430 (hereinafter referred to as document 3) discloses a power generation roof tile comprising a roof tile main body made of a cement or a metal and a solar cell bonded on the surface of a functioning portion of the roof tile main body, wherein an opaque sheet which is difficult to slip is bonded on the surface of the solar cell in a state capable of being peeled. Document 3 describes that when the power generation roof tile is installed, power generation by the solar cell does not takes place because the solar cell is covered by the opaque sheet and therefore, the execution work can be securely performed while preventing the surface of the solar call from being damaged or stained.

SUMMARY OF THE INVENTION

In the case of a power generation station or the like it which a sunlight power generation system is used as the power source, all the accommodations are necessary to be installed within a controlled environment, where any person besides the persons concerned who are acquainted with electric things is not allowed to enter therein.

The present inventors conceived a solar cell structural body having a solar cell whose conductor portions are partly contacted with a concrete retaining body provided to retain said solar cell from the non-light receiving face side, which would be suitable to install in such controlled environment as described in the above.

FIGS. 12(A) and 12(B) are schematic views for explaining a solar cell whose exposed conductor portions are partly contacted with a concrete retaining body (not shown) provided to retain the solar cell from the non-light receiving face side. Particularly, FIG. 12(A) is a schematic view illustrating a solar cell [which is retained on a concrete retaining body (not shown)] before a weathering-resistant coat film is formed thereon. FIG. 12(B) is a schematic view illustrating said solar cell after said weathering-resistant coat film is formed thereon.

In FIGS. 12(A) and 12(B), reference numeral 1201 indicates a photovoltaic element, reference numeral 1202 a positive electrode, reference numeral 1203 a negative electrode, and reference numeral 1204 a weathering-resistant coat film. The solar cell means a structure comprising a photovoltaic element 1201, a positive electrode 1202 and a negative electrode 1203.

By forming a weathering-resistant coat film 1204 on the light-receiving face side of the solar cell as shown in FIG. 12(B), it is possible to make the solar cell [see, FIG. 12(A)] have weathering-resistance.

To be more specific, the photovoltaic element 1201 is made so as to have weathering-resistance by forming the weathering-resistant coat film 1204 so as to cover the light-receiving face thereof, wherein for the positive electrode 1202 and the negative electrode 1203, at least their portions which serve to electrically connect the solar cell with an adjacent solar cell (not shown) are exposed without being covered by the coat film, where there will be an occasion in that the exposed portions (that is, the exposed conductor portions) of the positive and negative electrodes of the solar cell are directly contacted with the concrete retaining body (not shown). And if the structure should be such that a clearance is present between the solar cell and the concrete retaining body, there will be an occasion in that aforesaid exposed conductor portions of the positive and negative electrodes of the solar cell are indirectly contacted with the concrete retaining body through rain water or the like present in said clearance.

Now, the present inventors conducted trials in the following manner.

Focusing on a relatively inexpensive concrete member as a trestle, a plate member made of a concrete was arranged on the ground and the base member of the foregoing solar cell is directly mounted on the concrete plate member to form a solar cell installed structural body (hereinafter referred to as "solar cell structural body"). In this way, a plurality of solar cell structural bodies were formed. And these solar cell structural bodies were connected with each other in series connection to form a solar cell array.

The solar cell array thus formed was subjected to power generation. As a result, it was found that such shortcomings as will be described below and which are required to be solved are present.

That is, in the case of a solar cell structural body in which a concrete member is used as the retaining body, as the concrete member, there is used a concrete member which is generally formed from a mixture composed of a cement, water, an aggregate (comprising fine aggregates and rough aggregates) and the like. Thus, the electric resistance value of the concrete member greatly differs depending on the mixing ratio of these materials. In addition, because the concrete member has water absorption properties, the specific resistance value (the resistivity) thereof is reduced when the concrete member absorbs water. Therefore, depending on the installation form of the solar cell structural body, a problem may arise that leakage current from the exposed conductor portions of the solar cell which are contacted with the concrete member flows to the installation face while passing through the concrete member, where a large power loss occurs.

Accordingly, the present invention is aimed at solving the foregoing problem that occurs because the exposed conductor portions of the solar cell are contacted with the concrete member as described in the above.

Another object of the present invention is to provide a solar cell structural body which is always free from the aforesaid problem without depending on the installation form.

A further object of the present invention is to provide a solar cell array in which said solar cell structural body is used.

A still further object of the present invention is to provide a sunlight power generation system in which said solar cell structural body is used.

A typical embodiment of the solar cell structural body of the present invention has a solar cell arranged on a concrete retaining body comprising a concrete prepared from a mixture comprising at least a cement, water and an aggregate, such that part of a conductor portion of said solar cell is contacted with said concrete retaining body, characterized in that said concrete member has a resistivity in a range of from $9 \times 10^3$ to $120 \times 10^3$ Ω·cm.

The solar cell structural body of the present invention is preferred to additionally include the following features:
that the water to cement ratio of the concrete upon the production thereof is less than 40% by weight;
that the mixing ratio of the aggregate to the cement is at least 1:4 by weight;
that the cement comprises a Portland cement or an alumina cement;
that the concrete comprises a concrete hardened in atmospheric air;
that the concrete retaining body serves as a back face member or a trestle for the solar cell;
that the retaining body does not contain a reinforcement;
that the solar cell has two electrically conductive portions having a different polarity, one on the light receiving face side and the other on the non-light receiving face side; and
that when the density of the concrete retaining body is made to be $d[Kg/m^3]$, the inclination angle of the retaining body from the ground face is made to be $\theta$, and the thickness of the retaining body is made to be $t[m]$, the relation equation: $t > 1307.9 \ (0.71+0.016 \times \theta)/(d \times g \times \cos \theta)$ is established.

The solar cell array of the present invention is characterized in that said solar cell array has a plurality of solar cell structural bodies having such configuration as above described which are connected with each other in series connection.

In a preferred embodiment, a positive electrode terminal or a negative electrode terminal of the solar cell array is electrically grounded.

The sunlight power generation system of the present invention is characterized in that said sunlight power generation system has a connection body in which one or more solar cell structural bodies having such configuration as above described are electrically connected and said connection body has a positive electrode terminal and a negative electrode terminal which are connected to an inverter having a ground sensor accommodated therein.

In a preferred embodiment, each solar cell structural body has a ground current $I_{leak}$ of less than 100 mA.

Other features and advantages of the present invention will be apparent from the following description taken in conjunction with the accompanying drawings.

BRIEF DESCRIPTION OF THE DRAWINGS

FIG. 3 is a schematic diagram for explaining conditions under which a concrete retaining body in a plate form is immobilized in the present invention.

FIG. 4 is a schematic diagram illustrating a method for measuring a resistivity of a concrete member in the present invention.

FIG. 6 is a graph exemplifying interrelations between power loss of a solar cell array and resistivity of a concrete retaining body.

FIG. 9 is a graph of a sunlight power generation system in Example 1 which will be detailed later, exemplifying interrelations between power losses of said sunlight power generation system and resistivities of the concrete retaining body.

FIG. 10 is a graph of concrete members as the concrete retaining body described in Example 1 which will be detailed later, exemplifying interrelations between resistivities of said concrete members and the water to cement ratios of said concrete members.

DETAILED DESCRIPTION OF THE INVENTION AND PREFERRED EMBODIMENTS

Figure 1:
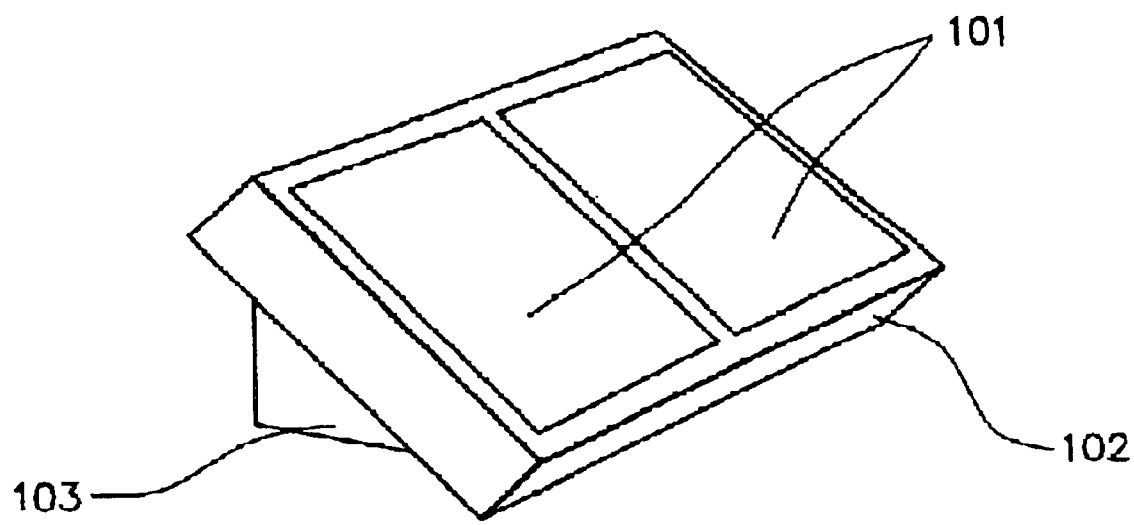
FIG. 1 is a schematic view illustrating an example of the structure of a solar cell structural body of the present invention.

As previously described, the present invention typically provides a solar cell structural body having a solar cell arranged on a concrete retaining body comprising a concrete prepared from a mixture comprising at least a cement, water and an aggregate, such that part of a conductor portion of said solar cell is contacted with said concrete retaining body, characterized in that said concrete has a resistivity in a range of from $9 \times 10^3$ to $120 \times 10^3 \Omega \cdot cm$.

In the following, typical preferred embodiments of the solar cell structural body of the present invention will be described while referring to the drawings. It should be understood that the present invention is not restricted by these embodiments.

First, description will be made or a method for measuring a resistivity of a concrete member.

In the measurement of the electric resistance of a sample to be inspected (this sample will be hereinafter referred to as "inspective sample"), there is present a relationship of $R = E/I$ (Ohm's law) between electric resistance $R(\Omega)$, voltage $E(V)$ and electric current $I(A)$. Therefore, in the present invention, as shown in FIG. 4, by connecting an alternating current through a pair of metal electrodes 402 arranged to oppose each other through an inspective sample 401 (comprising a concrete member) which is arranged between said pair of metal electrodes, a voltage between the two electrodes 402 is measured. The reason why the alternating current is used is for eliminating a cause of entailing a measurement error with respect to an electric resistance due to the polarization action at an interface between each of the two electrodes 402 and the inspective sample 401. As the alternating current, there is used an alternating current outputted from an AC standard voltage and current generator 403 (output current: 1 mA to 60 A; output voltage: 1 mV to 1200 V; output frequency: 40 to 500 Hz). For the measurement of the aforesaid voltage, there is used a digital multiple meter 404 (the measurement of a voltage at a given alternating current and at a given direct current and the measurement of an electric current can be performed).

The resistivity ($\Omega cm$) of the concrete member was computed by the equation: $= (E/I) \times (A/L)$, with E being a measured voltage (V) between the two electrodes, I being an electric current (A), A being a cross section area ($cm^2$), and L being an interval between the two electrodes 402, where said interval corresponds to the length of the concrete member 401.

At the time of measuring the electric resistance, the inspective sample 401 (the concrete member) is sufficiently contacted with the two electrodes 402 by means of a G-clamp 405. In the case where the inspective sample 401 is a concrete member hardened in water, moisture on the surface of the concrete member is sufficiently swabbed.

Description will be made of interrelation between power loss of the solar cell structural body and a concrete retaining body used therein in the case of a solar cell array comprising a plurality of solar cell structural bodies electrically connected with each other.

Figure 5A:
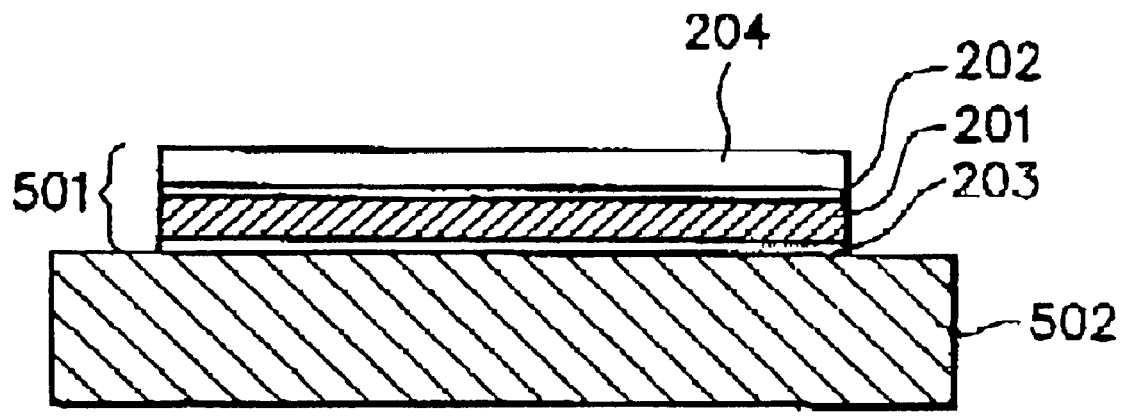
FIGS. 5(A) and 5(B) are schematic views illustrating an embodiment of a state of a solar cell structural body of the present invention when said solar cell structural body is directly installed on the surface of the ground.

Here, each of the solar cell structural bodies of the solar cell array has such structure as shown in FIG. 5(A). In FIG. 5(A), reference numeral 501 indicates a solar cell comprising a photovoltaic element 201, a positive electrode 202, a negative electrode 203, and a weathering-resistant coat film 204. Reference numeral 502 indicates a concrete retaining body in a plate form.

It is presumed that the solar cell structural bodies of the solar cell array are made to be in a state that electric current generated by each of the solar cell structural bodies is the most likely to flow to the ground, that is, the solar cell structural bodies are directly installed on the ground such that the contact area of the surface of the ground with the concrete retaining body (in a plate form) which is contacted with the exposed conductor portion of the solar cell of each solar cell structural body becomes maximum.

Figure 5B:
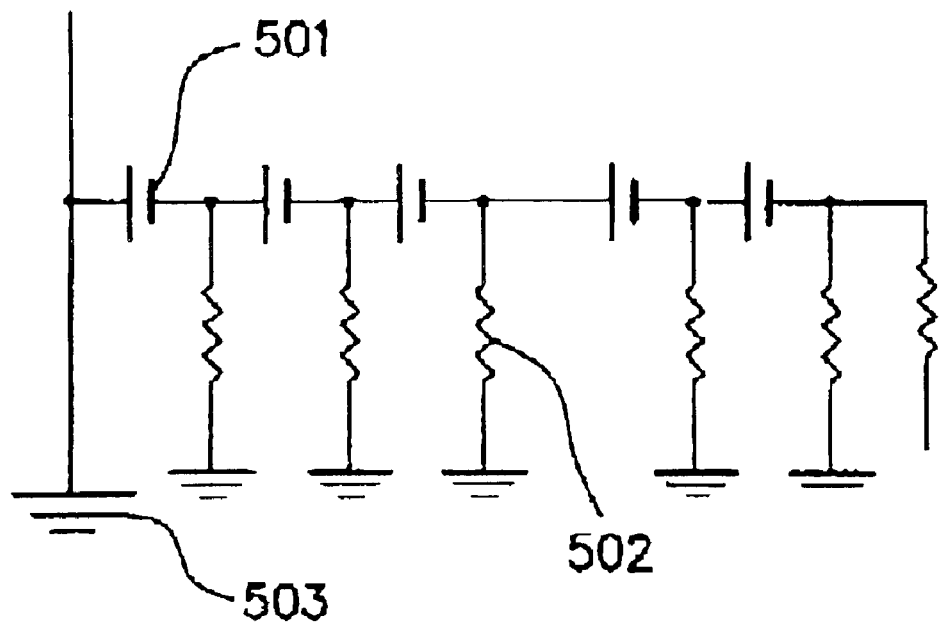

FIG. 5(B) is a schematic diagram illustrating a circuit in this case. In FIG. 5(B), reference numeral 501 indicates a solar cell, reference numeral 502 a concrete retaining body, and reference numeral 503 the ground.

In this case, when the maximum output voltage of the entire solar cell array is made to be Vmp(V), the maximum output current of each solar cell is made to be Imp (A), the contact area of the conductor portion of each solar cell with the concrete retaining body is made to be S(cm$^2$), the thickness of each concrete retaining body is made to be d(cm), the power loss of the entire solar cell array is made to be P$_{loss}$(%), the resistance between each solar cell and the ground is made to be r(Ω), and the resistivity of each concrete retaining body is made to be ρ (Ω·cm), the following equation is established.

$$P_{loss}=(Vmp/2)\times(1/r)\times(1/Imp)\times 100$$

Further, in this case, presuming that there is substantially no contact resistance between each concrete retaining body and the ground, the following equation is established between the resistance r(Ω) between the ground and the solar cell and the resistivity ρ (Ω·cm) of the concrete retaining body.

$$r \approx \rho \times (d/S)$$

Thus, for a solar cell array comprising a plurality of solar cell structural bodies electrically connected with each other, interrelations between the power losses of the solar cell structural bodies and the concrete retaining bodies can be obtained, when the maximum output voltage Vmp(V) of the entire solar cell array, the maximum output current Imp (A) of each solar cell, the contact area S(cm$^2$) of the conductor portion of each solar cell with the concrete retaining body, the thickness d (cm) of each concrete retaining body, and the resistivity ρ (Ω·cm) of each concrete retaining body are found.

For instance, in the case where a sunlight power generation system is prepared using the solar cell array of the present invention, when the number of the series connections of the solar cells is decreased while the number of the parallel connections is increased, it is possible that some of the related components such as diodes are cut to reduce the production cost. In this case, there is a tendency in that the maximum output voltage becomes small but the maximum output current becomes large. Separately, when the thickness of the concrete retaining body is increased, the resistivity thereof is increased and besides, the wind endurance strength of the system is improved.

FIG. 6 is a graph exemplifying interrelations between power losses of a solar cell array (comprising a plurality of solar cell structural bodies electrically connected with each other) and resistivities of the concrete retaining body in each solar cell structural body.

Here, for each of the solar cell structural bodies, the contact area S of the concrete retaining body with the conductor portion of the solar cell was made to be 849.2 cm$^2$ in order to make it possible to readily handle the solar cell structural body by one person. The maximum output voltage Vmp of the entire solar cell array (wherein leakage current is relatively liable to flow) was made to be 60 V. The maximum output current Imp of the solar cell in each solar cell structural body was made to be 4.5 A. For the concrete retaining body in each solar cell structural body, the thickness d thereof was made to be 8 cm, and the resistivity ρ thereof was varied in a range of 0 to 60×10$^3$ Ω·cm.

As shown in FIG. 6, it is understood that when the resistivity of the concrete retaining body is less than about 9×10$^3$ Ω·cm (at a point indicated by reference numeral 601), the power loss P$_{loss}$ suddenly starts increasing.

Incidentally, in terms of using the solar cell structural body, when the thickness of the concrete retaining body is made to be smaller than the aforesaid value, the wind endurance strength of the solar cell structural body becomes insufficient. And when the maximum output voltage is made to be higher than the aforesaid value, the electric security becomes difficult to be ensured. Therefore, it is considered that the solar cell structural body will never be used under worse conditions than this. In this respect, as long as the resistivity of the concrete retaining body is more than 9×10$^3$ Ω·cm, it is possible to form an appropriate solar cell structural body without having a due care about the installation form. When the resistivity of the concrete retaining body is less than 120×10$^3$ Ω·cm, it is possible to form an appropriate solar cell structural body which can be ensured in terms of the wind endurance strength.

Description will be made of the solar cell structural body of the present invention, having a solar cell arranged on a concrete retaining body formed from a mixture composed of a cement, an aggregate and water such that part of a conductor portion of said solar cell is contacted with said concrete retaining body, with reference to the drawings.

FIG. 1 is a schematic view illustrating an example of the structure of a solar cell structural body of the present invention. In FIG. 1, reference numeral 101 indicates a solar cell, reference numeral 102 a concrete retaining body, and reference numeral 103 a concrete back face retaining body. In FIG. 1, two solar cells 101 are arranged and fixed on the concrete retaining body 102, and the concrete retaining body 102 is sloped by means of the concrete back face retaining body 103 at an optimum inclination angle so that the light receiving face of each of the two solar cells can sufficiently receive irradiation of sunlight, as shown in FIG. 3 (explanation of FIG. 3 will be made later).

In the structure of the solar cell structural body shown in FIG. 1, a conductor portion of the solar cell 101, namely an electrode portion and an electric connection portion at the back face of the solar cell are contacted with the surface of the concrete retaining body 102.

Figure 2:
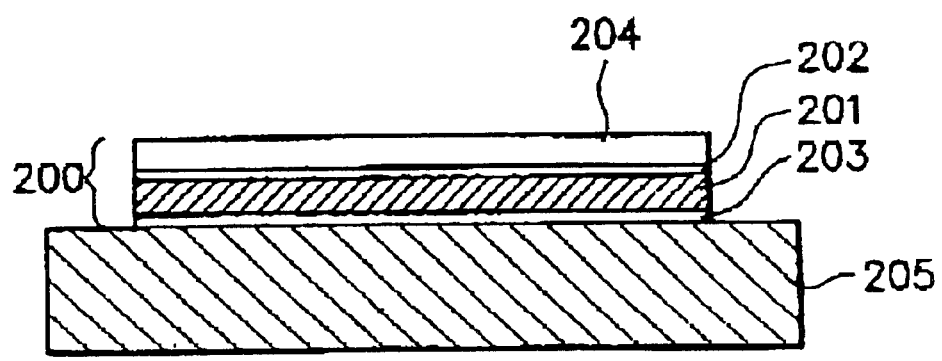
FIG. 2 is a schematic cross-sectional view illustrating an example of the constitution of a solar cell used in a solar cell structural body of the present invention.

FIG. 2 is a schematic cross-sectional view illustrating an example of the solar cell used in the solar cell structural body shown in FIG. 1. In FIG. 2, reference numeral 200 (corresponding to reference numeral 101 in FIG. 1) indicates a solar cell comprising a photovoltaic element 201. a positive electrode 202, a negative electrode 203 and a weathering-resistant coat film 204. Reference numeral 205 (corresponding to reference numeral 102 in FIG. 1) indicates a concrete retaining body.

The solar cell is arranged and fixed on the concrete retaining body as shown in FIG. 2. And as shown in FIG. 3, the concrete retaining body is sloped by means of the concrete back face retaining body (103; see, FIG. 1) at an optimum inclination angle so that the light receiving face of the solar cell can sufficiently receive irradiation of sunlight so as to enable the solar cell to have an optimum power generation efficiency.

At this time, there would be a possibility that the conductor portions (the electrode portion and the electric connection portion) at the back face of the solar cell are contacted with the concrete retaining body (102; see, FIG. 1) and the power generated by the solar cell is leaked to the ground. However, by using a concrete retaining body having a resistivity of more than 9×10$^3$ Ω·cm as the concrete retaining body, it is possible to minimize occurrence of power loss. Separately, by adopting such installation manner as above described, the concrete retaining body (102) is contacted with the concrete back face retaining body (103)

[which is contacted with the ground] by way of line contact (see, FIG. 3) and it is also contacted with the ground by way of line contact through a lower end portion thereof.

Thus, the concrete retaining body is contacted with the ground at two positions, i.e., at a position of [the concrete retaining body/the ground] where the concrete retaining body is contacted with the ground by way of line contact and at a position of [the concrete retaining body/the back face retaining body/the ground] where the concrete retaining body is contacted with the back face retaining body by way of line contact. Therefore, the resistance value between the solar cell and the ground in this is greater than that in the case where the concrete retaining body is directly contacted with the surface of the ground by way of face-to-face contact, and therefore, the leakage current from the solar cell to the ground is diminished to minimize the power loss.

FIG. 3 is a schematic diagram for explaining conditions under which a concrete retaining body in a plate form is immobilized in the present invention.

In FIG. 3, reference numeral 101 indicates a solar cell, reference numeral 102 a concrete retaining body in a plate form, and reference numeral 103 a concrete back face retaining body. θ indicates an inclination angle (–) of the concrete retaining body 102. t a thickness [m] of the concrete retaining body, Ws a load [N] of the concrete retaining body, and Ww a wind load [N] for designing.

When the density of the concrete retaining body is made to be $d[Kg/m^3]$ and the area of the light receiving face side of the concrete retaining body is made to be $A[m^2]$, the load Ws can be expressed by the following equation (1).

$$Ws = A \times t \times d \times g [N] \qquad (1)$$

When the wind force coefficient is made to be Cw, the velocity pressure for designing is made to be $q[N/m^2]$ and the wind receiving area is made to be $A[m^2]$, the wind load Ww can be expressed by the following equation (2).

$$Ww = Cw \times q \times A [N] \qquad (2)$$

When the inclination angle of the concrete retaining body is made to be Bθ, the wind force coefficient Cw can be expressed by the following equation (3).

$$Cw = 0.71 + 0.016 \times \theta \qquad (3)$$

When the wind speed for designing is made to be V[m/s], the air density is made to be ρ [N·s$^2$/m$^4$], the height correction coefficient is made to be α, the application factor is made to be I, and the environment application factor is made to be J, the velocity pressure q for designing can be expressed by the following equation.

$$q \times \tfrac{1}{2} \times \rho V^2 \times \alpha \times I \times J$$

When V=60 m/s, ρ=1.274 N·s$^2$/m$^4$, α=0.496 (where the height of the concrete retaining body is made to be 30 cm), I=1.0 (when the solar cell 101 is an ordinary solar cell), and J=1.15 (environment with no obstacle), the velocity pressure q is computed as follows.

$$q = 1307.9 \ [Nm^2] \qquad (4)$$

The equation (4) is based on the assumption that the height of the concrete retaining body is 30 cm. The value will be necessary to be changed depending on the installation location.

By the equations (1) and (2), if the condition is that expressed by the following equation (5), the concrete retaining body does not move.

$$Ws \times \cos\theta > Ww \qquad (5)$$

When solved with respect to the thickness t of the concrete retaining body by substituting the equations (1) to (4), the result expressed by the following relation equation (6) is obtained.

$$t > 1307.9(0.71 + 0.016 \times \theta)/(d \times g \times \cos\theta) \qquad (6)$$

If the thickness of the concrete retaining body satisfies the relation of equation (6), the concrete retaining body is never moved by strong wind.

Therefore, an adequate thickness t for the concrete retaining body is necessary to be decided upon depending on the density d and the inclination angle θ of the concrete retaining body.

The above computation is based on the assumption of severe condition when the entire back face of the concrete retaining body receives wind in the case where the concrete retaining body does not have a back face retaining body.

However, in practice the concrete retaining body is sloped by using a back face retaining body as previously described with reference to FIG. 1. Therefore, there is not an occasion in that the entire back face of the concrete retaining body receives wind. Thus, it is sufficiently safe as long as the foregoing condition is satisfied.

In the following, supplementary explanation will be made of each of the materials constituting the solar cell structural body of the present invention.

Solar Cell:

The solar cell structural body of the present invention is of a very simple structure in that the solar cell is fixed to the concrete retaining body. Therefore, in consideration of the long reliability, the solar cell is preferred to be of the type that is thin and light-weight.

There is no particular limitation for the kind of the solar cell used. For instance, it is possible to use a solar cell comprising a thin film photovoltaic element comprising an amorphous silicon (a-Si) formed on a stainless steel substrate (this solar cell will be hereinafter referred to as "amorphous silicon type solar cells").

This amorphous silicon type solar cell is thin and light-weight and therefore, it is very convenient in the preparation of the solar cell structural body of the present invention. In addition, this amorphous silicon type solar cell has a flexible structure and because of this, for instance, even when the installation face of the concrete retaining body is in a curved form, it is possible that the amorphous silicon type solar cell is readily laminated and fixed on the curved installation face of the concrete retaining body.

Figure 7:
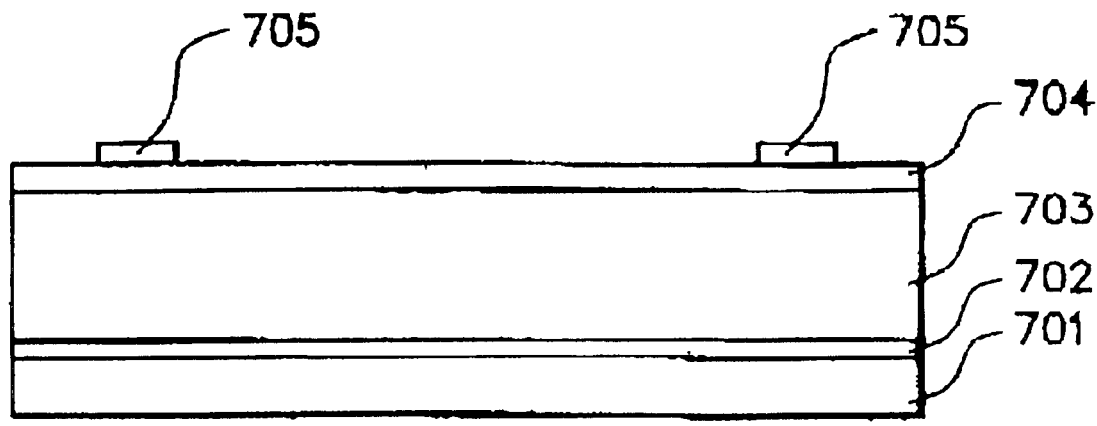
FIG. 7 is a schematic cross-sectional view illustrating the constitution of an amorphous silicon type solar cell which can be preferably used in a solar cell structural body of the present invention.
Figure 8:
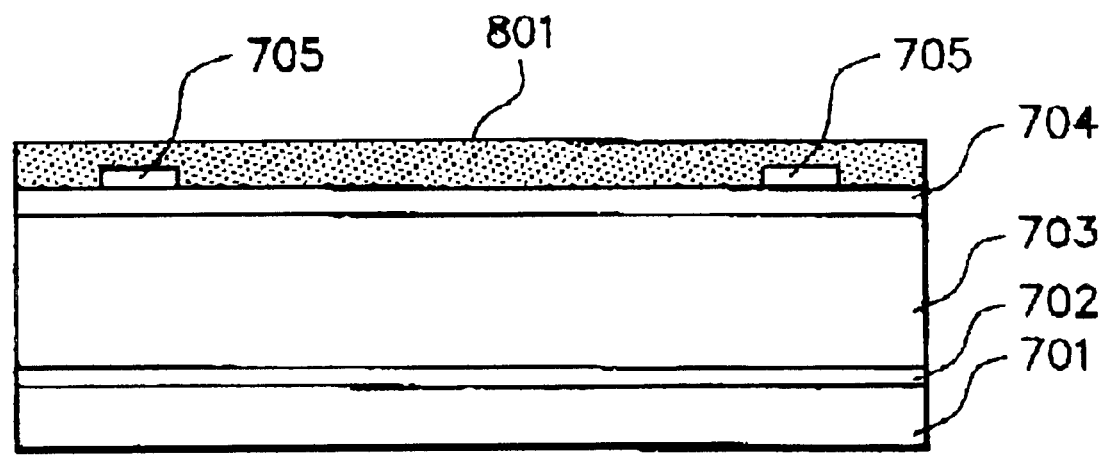
FIG. 8 is a schematic cross-sectional view illustrating an embodiment of forming a weathering-resistant coating film on the light receiving face side of the amorphous silicon solar cell shown in FIG. 7.

FIG. 7 is a schematic cross-sectional view illustrating an example of the constitution of the aforesaid amorphous silicon type solar cell. FIG. 8 is a schematic cross-sectional view illustrating an embodiment of forming a weathering-resistant coating film on the light receiving face side of the amorphous silicon type solar cell shown in FIG. 7. Reference numeral 801 in FIG. 8 indicates said weathering-resistant coating film.

The amorphous silicon type solar cell shown in FIG. 7 comprises a back side electrode layer 702 (or a back reflecting layer), an amorphous silicon (a-Si) semiconductor photoactive layer 703 and a transparent electrically conductive layer 704 stacked in this order on a substrate 701 and a collecting electrode 705 formed on the transparent electrically conductive layer 704.

This amorphous silicon type solar cell can be prepared for instance, in the following manner.

On a well-cleaned stainless steel substrate 701, an Al layer and a ZnO layer are sequentially formed by a sputtering method to form a two-layered metal electrode layer as the back side electrode layer 702 (or the back reflecting layer). Then, on the back side electrode layer 702, an a-Si semiconductor photoactive layer 703 having one or more semiconductor junctions is formed by a plasma CVD method. Successively, on the a-Si semiconductor photoactive layer 703, an $In_2O_3$ thin film as the transparent electrically conductive layer 704 is formed by a resistance-heating evaporation method. Finally, on the transparent electrically conductive layer 704, a collecting electrode 705 is formed using an Ag-paste by means of screen printing. Thus, an amorphous silicon type solar cell is obtained.

Then, in order to make the amorphous silicon type solar cell have weathering-resistance to environments outdoors, a weathering-resistant coat film 801 is formed so as to cover the light receiving face of the amorphous silicon type solar cell by using for instance, an acrylic resin coating composition having weathering-resistance, as shown in FIG. 8.

Solar Cell Structural Body:

The solar cell structural body of the present invention includes a structure in that a solar cell and a concrete retaining body are integrated and a structure in that a solar cell and a concrete retaining body and this integrated structural body is supported by a back face retaining body.

The solar cell may be fixed onto the concrete retaining body by means of a metal fixture or by directly bonding and fixing the solar cell to the concrete retaining body. The concrete retaining body itself is heavy and therefore, only by placing the concrete retaining body on the surface of the ground, may the arrangement thereof be completed. In the case where the back face retaining body is used, only by arranging the concrete retaining body on the back face retaining body, may the arrangement thereof be completed. By doing it in this way, it is possible to establish a solar cell structural body whose structure is simple and which excels in terms of the execution of work efficiency.

Concrete Retaining Body:

The concrete retaining body means a member for fixing the solar cell. In the sunlight power generation system, the concrete retaining body corresponds to a member to form a trestle or an installation face in general.

In the present invention, because the structure is simple and the installation work becomes easier, a concrete member is used as the concrete retaining body. When the concrete member as the concrete member as the concrete retaining body is heavy, only by placing the concrete member on the surface of the ground, may the arrangement thereof be completed.

And because the concrete member as the concrete retaining body excels in durability outdoors and it is relatively inexpensive, it is very convenient to use the concrete member as the trestle for the solar cell.

In the case where the concrete retaining body is shaped in a plate form, there is an advantage such that after the back face retaining body is arranged at a desired location, the concrete retaining body of the solar cell structural body is arranged an the back face retaining body, where the inclination angle of the solar cell structural body can be desirably changed.

In the case where the concrete retaining body is shaped in a plate form, as previously described, when the density of the concrete retaining body is made to be $d[Kg/m^3]$, the inclination angle of the concrete retaining body from the ground surface is made to be $\theta$ and the thickness of the concrete retaining body is made to be $t(m)$, it is preferred the foregoing relation equation (6), that is, $t>1307.9(0.71+ 0.016\times\theta)/(d\times g\times\cos\theta)$, is established.

As long as this condition is satisfied, it is possible to prevent the concrete retaining body from being moved upon blowing of strong wind (wind speed: 60 m/s).

Back Face Retaining Body:

The back face retaining body is a member arranged on the back face side of the concrete retaining body. The back face retaining body is not necessary to be used depending on the form of the concrete retaining body. To use the back face retaining body is advantageous in that when it is used as a sleeper member for the concrete retaining body shaped in a plate form, the inclination angle of the concrete retaining body can be freely changed by means of the sleeper member.

The back face retaining body may be shaped in a rectangular parallelopiped form. The back face retaining body serves to retain the concrete retaining body and therefore, the back face retaining body is necessary to have a sufficient compressive strength such that the back face retaining body is hardly deformed even upon the application of a large load. In addition, the back face retaining body is preferred to have durability against environments outdoors. Thus, the back face retaining body is preferred to comprise a material which satisfies these requirements. As such material, there can be mentioned, for example, concretes, stones, and bricks.

Cement:

As the cement used for forming the concrete retaining body in the present invention, it is possible to use natural or artificial inorganic powders capable of being waterhardened. As specific examples of the cement usable in the present invention, there can be mentioned ordinary Portland cement special Portland cement, alumina cement, and Roman cement. Besides, acid proof cement, refractory cement, and water glass cement are also usable. Of these cements, ordinary Portland cement, special Portland cement, and alumina cement are particularly preferable because they excel in strength and waterproof.

Aggregate:

As the aggregate used for forming the concrete retaining body in the present invention, any aggregates can be selectively used as long as they are highly chemically and physically stable, they excel in durability and they have an appropriate average particle size in a range of 150 μm to 10 mm. It is more preferred that they have a large adhesive force with a cement paste and they contain neither organic materials which hinder a cement from being hardened or/and promote a concrete to be deteriorated nor harmful impurities such as chemical salts. As such aggregate, there can be mentioned, for example, natural aggregates such as river sands, river gravels, sea sands, sea gravels, mountain sands, and mountain gravels; and artificial aggregates such as crushed sands, crushed stones, and slag-crushed stones. Of these, river sands, river gravels, mountain sands, mountain gravels and crushed stones which substantially do not contain salt substances which hinder the electrical conductivity of the concrete are preferred.

Weathering-resistant Coat Film:

In the present invention, the weathering-resistant coat film is used for protecting the solar cell from severe external environments such as temperature changes, humidity changes, externally applied shocks and the like. The weathering-resistant coat film is preferred to comprise a soft weathering-resistant resin film having an elasticity for the reasons that the resin film is not readily damaged even when the resin film receives a mechanical load and when the solar cell is provided on an alkaline fresh concrete, the resin film prevents the solar cell from being corroded by the alkali.

Such weathering-resistant resin film as the weathering-resistant coat film is preferred to be constituted by an adequate resin. Such resin can include polyolefin series resins such as ethylene-vinyl acetate copolymer (EVA), ethylene-methylacrylate copolymer (EMA), ethylene-ethylacrylate copolymer (EEA), and butyral resin and urethane resins. Besides, acrylic resins, polyesters, and fluororesins are also usable.

Water to Cement Ratio:

The water to cement ratio means a mass ratio or a mass percentage between the water content and the cement content in a paste immediately after being mixed by kneading which is contained in a concrete or a mortar.

The strength of a concrete is generally decided by the water to cement ratio. The water to cement ratio (the symbol: W/C the unit: %) is used when a unit cement quantity is computed in the design of mix.

In the following, the features and advantages of the present invention will be described in more detail by reference to the following example, which is provided merely for illustrative purposes and is not intended to limit the scope of the present invention.

Example 1

In this example, description will be made of an example of a solar cell structural body having a solar cell on a concrete retaining body formed from a mixture composed of water, a Portland cement and an aggregate (principally comprising crushed stones and crushed sands), such that part of a conductor portion of said solar cell is contacted with said concrete retaining body.

1. Preparation of Solar Cell:

An amorphous silicon type solar cell having such configuration as shown in FIG. 7 and FIG. 8 was prepared as will be described below.

A roll having a well-cleaned stainless steel web (thickness: $125 \times 10^{-6}$ m) wound thereon was set to a roll-to-roll type multi-chambered sputtering apparatus, where an Al layer having a thickness of $5 \times 10^{-7}$ m and a ZnO layer having a thickness of $5 \times 10^{-7}$ m were continuously formed in this order on the stainless steel web which was continuously moving, whereby a metal layer having a two-layered structure as the back side electrode layer 702 was formed on the stainless steel web as the substrate 701. The stainless steel web having the back side electrode layer 702 formed thereon wound in a roll form was introduced into a roll-to-roll multi-chambered plasma CVD apparatus, where on the stainless steel web which was continuously moving, there were sequentially formed a first semiconductor layer having a stacked structure comprising a $15 \times 10^{-9}$ m thick n-type a-Si semiconductor layer/a $4 \times 10^{-7}$ m thick i-type a-Si semiconductor layer/a $1 \times 10^{-8}$ m thick p-type μc-Si semiconductor layer and a second semiconductor layer having a stacked structure comprising a $1 \times 10^{-8}$ m thick n-type a-Si semiconductor layer/a $8 \times 10^{-8}$ m thick 1-type a-Si semiconductor layer/a $1 \times 10^{-8}$ m thick p-type μc-Si semiconductor layer to form a tandem type a-Si series semiconductor photoactive layer 703, wherein each n-type a-Si semiconductor layer was formed from a mixed gas comprising $SiH_4$, $PH_3$ and $H_2$; each i-type a-Si semiconductor layer was formed from a mixed gas comprising $SiH_4$ and $H_2$; and each p-type μc-Si semiconductor layer was formed from a mixed gas comprising $SiH_4$, $BF_3$ and $H_2$. The stainless steel web having the back side electrode layer 702 and the semiconductor photoactive layer 703 formed thereon wound in a roll form was introduced into a roll-to-roll type resistance heating evaporation apparatus, where on the stainless steel web which was continuously moving, an ITO film having a thickness of $7 \times 10^{-8}$ m as the transparent electrically electrode layer 704 was formed on the semiconductor photoactive layer 703 by evaporating In in an $O_2$ atmosphere. The stainless substrate web having the back side electrode layer 702, the semiconductor photoactive layer 703 and the transparent electrically electrode layer 704 formed thereon in this order was cut to obtain 80 photovoltaic elements having a size of 240 mm×360 mm.

Figure 12A:
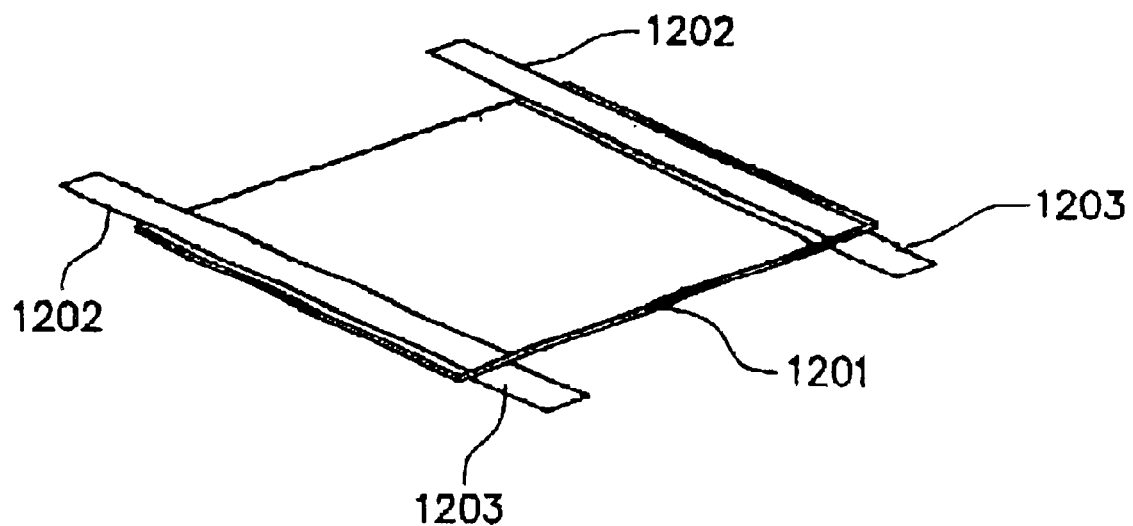
FIG. 12(A) is a schematic view illustrating a solar cell [which is retained on a concrete retaining body (not shown)] before a weathering-resistant coat film is formed thereon in the present invention.

For each of the 80 photovoltaic elements, on the transparent electrically electrode layer 704 thereof, a collecting electrode 705 was formed by a method of screen-printing an Ag-paste to form a pattern as the collecting electrode and subjecting said pattern to a heat treatment in an oven. Then, for each photovoltaic element, at each of the opposite side end portions (where the collecting electrode 705 is wired) of the transparent electrically electrode layer 704, a copper tab as the positive electrode was fixed using a double-coated adhesive tape shown in FIG. 12(A) (see, reference numeral 1202). Similarly, a copper tab as the negative electrode was fixed to each of the opposite side end portions of the substrate 701 by way of welding as shown in FIG. 12(A) (see, reference numeral 1203). Thus, there were obtained 80 solar cells.

Figure 12B:
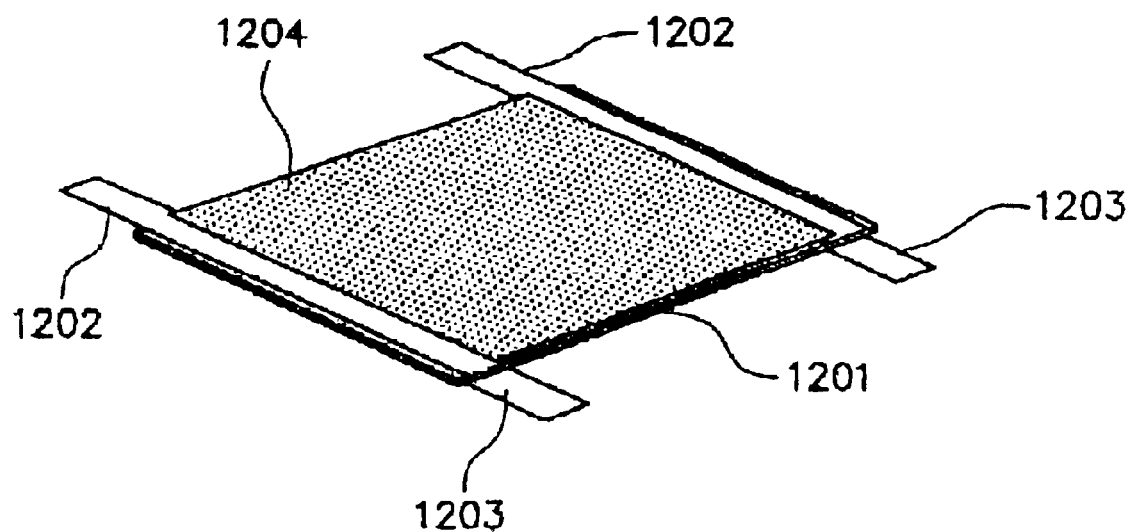
FIG. 12(B) is a schematic view illustrating the solar cell shown in FIG. 12(A) after aforesaid weathering-resistant coat film is formed thereon in the present invention.

For each of the resultant 80 solar cells, a weathering-resistant coat film (801) having a thickness of 120 μm was formed in a state as shown in FIG. 12(B) (see, reference numeral 1204) by a method of applying an acrylic resin series coating composition on the light receiving face except for the copper tabs (the positive electrodes) by an air-spraying method and subjecting the acrylic resin series coating composition applied to a curing treatment in an oven.

Thus, there were obtained 80 solar cells having the weathering-resistant coat film formed thereon.

The rating of each of the 80 solar cells was; Vpm=1.4 V and Ipm×4.6 A.

2. Preparation of Concrete Retaining Body:

A concrete plate having a size of 500 mm (height)×800 mm (length)×100 mm (thickness) as the concrete retaining body was prepared by using a mixture composed of water, an ordinary Portland cement and an aggregate, where the water to cement ratio was made to be 40% and the mixing volume ratio of the aggregate to the cement was made to be 3:10. In this way, there were prepared 40 concrete plates having a size of 500 mm (height)×800 mm (length)×100 mm (thickness) respectively as the concrete retaining body.

The thickness of each of the concrete plates as the concrete retaining body is understood to be free from a fear that the concrete plate is moved upon blowing such strong wind of a wind speed of 60 m/s for the following reason That is, when θ=30°, d=2300 Kg/m³ and g=9.8 m/s² are substituted into the foregoing relation equation (6), that is, $t > 1307.9(0.71+0.016 \times \theta)/(d \times g \times \cos \theta)$, there is obtained $t > 0.0797$ m.

Separately, 40 commercially available ordinary concrete blocks having a size of 190 mm (height)×390 mm (length)× 190 mm (thickness) for use in construction were provided as the back face retaining body.

3. Preparation of solar Cell structural body:

Using the 80 solar cells obtained in the above step 1, the 40 concrete plates obtained in the above step 2, and the 40 concrete blocks provided in the above step 2, there were prepared 40 solar cell structural bodies having such structure as shown in FIG. 1 in the following manner.

On a concrete face as the ground face, one of the 40 concrete blocks as the back face retaining body 103 was arranged. Then one of the 40 concrete plates as the concrete retaining body 102 was arranged so as to lean against the back face retaining body 103. Here, the inclination angle of the concrete retaining body 102 was made to be 30°.

Thereafter, two (101) of the 80 solar cells were laminated on the surface (the installation face) of the concrete retaining body 102 as shown in FIG. 1. At this time, an insulating epoxy elastic adhesive PM 165 (produced by Semidine Company) was evenly coated on the entire back face (excluding the negative electrodes) of each of the two solar cells 101 and the two solar cells were laminated on the installation face of the concrete retaining body 102 through their back faces applied with the insulating adhesive. In this case, the stainless steel substrate of each of the two solar cells 101 is electrically isolated from the concrete retaining body 102 but the copper tabs as the exposed electrode portions of each of the two solar cells are at least partly contacted with the surface (the installation face) of the concrete retaining body 102.

And the two solar cells 101 were electrically connected with each other in parallel connection. Thus, there was obtained a solar cell structural body.

In this way, there were prepared 40 solar cell structural bodies having such structure as shown in FIG. 1.

Figure 11:
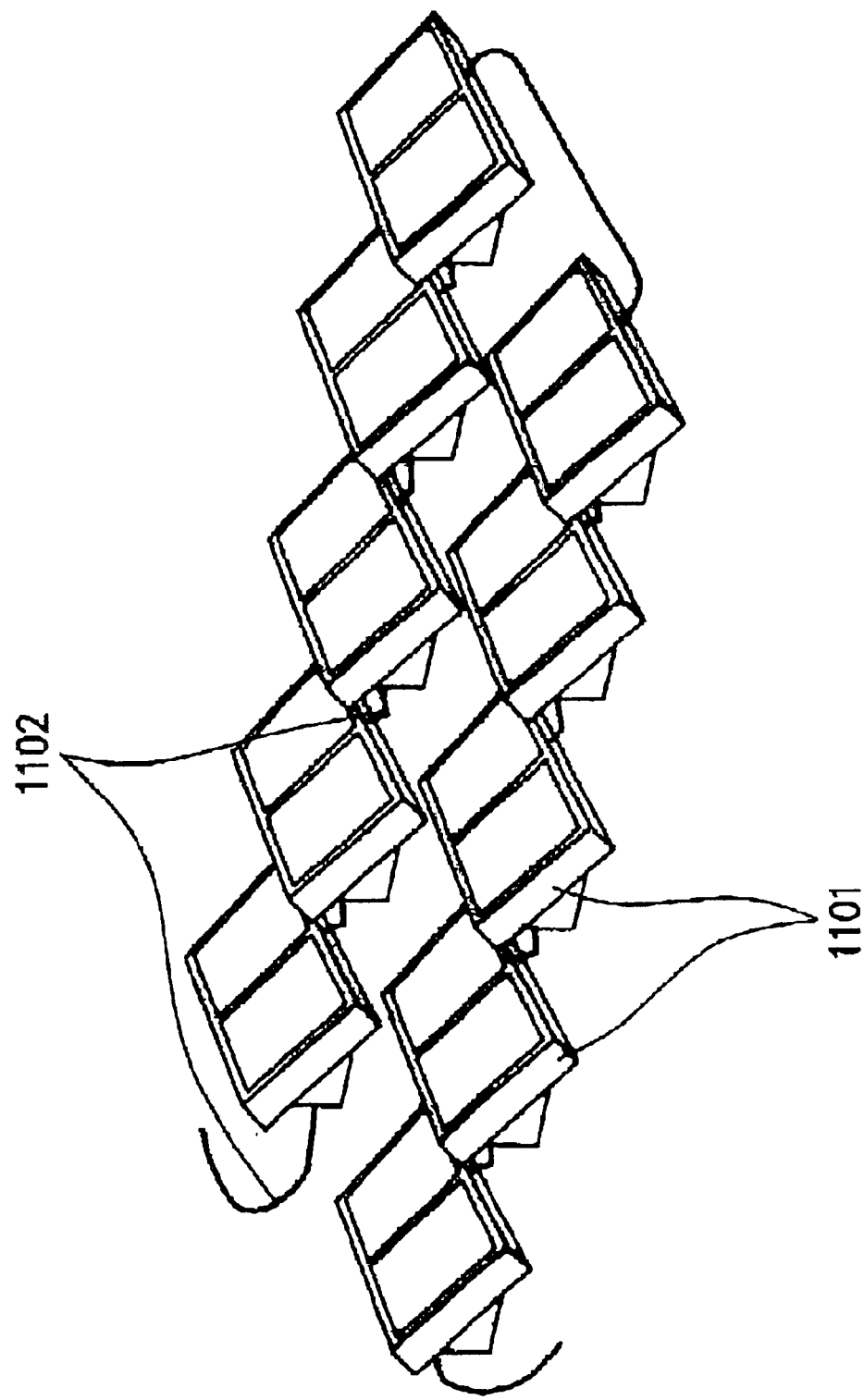
FIG. 11 is a schematic diagram for explaining an embodiment of connecting a plurality of solar cell structural bodies with each other in series connection in Example 1 which will be described later.

4. Preparation of Sunlight Power Generation System:

The 40 solar cell structural bodies obtained in the above step 3 were arranged and electrically connected with each other in series connection as shown in FIG. 11 to obtain a sunlight power generation system. In FIG. 11, reference numeral 1101 indicates a solar cell structural body, and reference numeral 1102 indicates a wiring member.

Particularly, the 40 solar cell structural bodies 1101 were arranged as shown in FIG. 11. Then the 40 solar cells of the 40 solar cell structural bodies 1101 were electrically connected with each other in series connection by means of the wiring members 1102 to obtain a sunlight power generation system. The total output voltage of the sunlight power generation system was made to be 56 V.

FIG. 9 is a graph of the sunlight power generation system in this example, exemplifying interrelations between power losses of said sunlight power generation system when the power generated by the solar cell of each of the solar cell structural bodies is leaked to the ground and resistivities of the concrete retaining body of each of the solar cell structural bodies.

To be more specific, FIG. 9 exemplifies interrelations between power losses of the sunlight power generation system and resistivities of the concrete retaining bodies using the following equations when the total output voltage of the sunlight power generation system was made to be 56 V, the maximum electric current generated by each of the solar cells was made to be 4.6 A, and the contact area of the conductor portions of the solar cell with the concrete retaining body with respect to each solar cell structural body was made to be 864 cm².

$$P_{loss}=(Vmp/2)\times(1/r)\times(1/Imp)\times 100$$

$$r=\rho\times(d/S)$$

From the graph shown in FIG. 9, it is understood that when the resistivity $\rho$ of the concrete retaining body becomes to be less than $9\times 10^3$ $\Omega\cdot$cm, the power loss is suddenly increased.

FIG. 10 is a graph of concrete members prepared using a Portland cement as the concrete retaining body, exemplifying interrelations between resistivities of said concrete members after having dried in atmospheric air for one week and water to cement ratios of said concrete members.

From the graph shown in FIG. 10, it is understood that the leakage current can be diminished by making the water to cement ratio upon the preparation of a concrete member as the concrete retaining body to be about 40%. It is also understood that by air-drying the concrete member, the resistivity thereof is increased, and therefore, the leakage current can be further depressed.

Separately, the structure adopted in this example is that the concrete retaining body is installed so as to incline by means of the back face retaining body, where the contact area of the concrete retaining body with the ground is markedly decreased and along with this, the resistance between the concrete retaining body and the ground is markedly increased. Because of this, the power loss of the power generated is more diminished.

As above described, according to the solar cell structural body in this example, by using a concrete retaining body prepared so as to have a resistivity $\rho$ of less than $9\times 10^3$ $\Omega\cdot$cm, it is possible to diminish the power loss which is occurred due to a cause that the power generated by the solar cell is leaked to the ground through the concrete retaining body.

Further, it is not necessary to use a member or the like in order to diminish the power loss and because of this, the work efficiency is improved and the power generation efficiency is improved. This results in a considerable reduction in the cost. Further, because the solar cell structural body has a sufficient wind compressive strength, it is possible to cut fixtures and the like, where the work efficiency is improved, and the apparatus cost can be considerably reduced. Thus, it is possible to achieve a highly reliable solar cell structural body.

As detailed in the above description, the present invention affords such significant advantages as will be described below.

(1) A typical embodiment of the solar cell structural body of the present invention has a solar cell arranged on a concrete retaining body comprising a concrete prepared from a mixture comprising at least a cement, water and an aggregate, such that part of a conductor portion of said solar cell is contacted with said concrete retaining body, characterized in that said concrete has a resistivity in a range of from $9\times 10^3$ to $120\times 10^3$ $\Omega\cdot$cm. In the solar cell structural body of the present invention, it is possible to diminish the quantity of the power generated by the solar cell which is leaked to the installation face from the conductor portion of the solar cell which is contacted with the surface of the concrete retaining body through the inside of the concrete retaining body, that is, the power loss of the power generated can be considerably diminished without depending on the installation method.

(2) By making the water to cement ratio upon the production of said concrete to be less than 40% by weight, it is possible that the water content in the concrete is depressed and the resistivity thereof is depressed after being hardened.

(3) By making the mixing ratio of the aggregate to the cement be at least 1:4 in terms of a weight ratio, it is possible that the water absorption coefficient of the concrete is decreased to reduce an influence of water to permeate into the concrete and to increase the resistivity of the concrete. In the case where sands are used as the aggregate, it is preferred to use sands whose chloride content is relatively small.

(4) When a Portland cement or an alumina cement is used as the cement, the use method thereof is simple and readily practiced in order to produce a concrete member in a desired form. In addition, it is possible to produce a concrete which excels in strength and durability. Further, these cements are relatively inexpensive and therefore, it is possible to reduce the production cost when these cements are used.

(5) The concrete is preferred to comprises a concrete hardened in atmospheric air. When the hardening is performed in water, the water content is increased. The hardening is preferred to perform in atmospheric air, where the water content is decreased to make it possible to increase the resistivity of the concrete.

(6) The concrete retaining body is capable of serving as a back face member of the solar cell or a trestle for the solar cell. When the solar cell is provided on the surface of the concrete retaining body, the solar cell itself is reinforced and the strength thereof is improved. Therefore, it is possible to considerably reduce reinforcing members and the like and it is possible to considerably reduce the production cost.

(7) The concrete retaining body does not contain a reinforcement and because of this, the resistivity of the concrete retaining body is not decreased. This enables to diminish the power loss of the solar cell structural body. Thus, the cost of the solar cell structural body can be remarkably reduced.

(8) The solar cell has two electrically conductive portions having a different polarity, one on the light receiving face side and the other on the non-light receiving face side and therefore, the solar cell is hardly short-circuited. Because of this, wiring works upon the installation can be smoothly performed. Therefore, the work efficiency is improved.

(9) When the density of the concrete retaining body is made to be $d[Kg/m^3]$, the inclination angle of the retaining body from the ground face is made to be $\theta$, and the thickness of the retaining body is made to be $t$ [m], the relation equation: $t>1307.9(0.71+0.016\times\theta)/(d\times g\times\cos\theta)$ is established. Thus, the concrete retaining body is not moved even upon blowing strong wind, and therefore, the solar cell structural body is highly reliable.

(10) The solar cell array of the present invention has a plurality of solar cell structural bodies of the present invention which are mutually connected in series and parallel connections and because of this, a desired power can be obtained depending on the connection method adopted.

(11) By electrically grounding the positive electrode terminal or the negative electrode terminal of the solar cell array, it is possible to make the control and protection apparatus and the like such that they are surely operated so as to prevent occurrence of leakage or/and abnormal voltage.

(12) The sunlight power generation system of the present invention having a connection body in which a plurality of solar cell structural bodies of the present invention are electrically connected and said connection body has a positive electrode terminal and a negative electrode terminal which are connected to an inverter having a ground sensor accommodated therein, and therefore, the power generated by the solar cell structural bodies can be efficiently outputted.

(13) Because, the ground current $I_{leak}$ of the solar cell structural body is less than 100 mA, in the case of the inverter, it is not stopped with the detection of said ground current (it is stopped at the time of more than 100 mA), and therefore, it is possible to prevent stoppage of the operation of the inverter.

What is claimed:

1. A solar cell structural body having a solar cell arranged on a concrete retaining body comprising a concrete prepared from a mixture comprising at least a cement, water and an aggregate, such that part of a conductor portion of said solar cell contacts said concrete retaining body, characterized in that said concrete has a resistivity in a range of from $9\times10^3$ to $120\times10^3$ $\Omega\cdot$cm, wherein the relation equation $t>1307.9(0.71+0.016\times\theta)/(d\times g\times\cos\theta)$ is established, with d being the density of said concrete retaining body measured in Kg/m³, $\theta$ being the inclination angle of said concrete retaining body from a ground face, t being the thickness of said concrete retaining body measured in meters, and g being the acceleration of gravity measured in m/s².

2. The solar cell structural body according to claim 1, wherein the water to cement ratio of said concrete upon the production thereof is less than 40% by weight.

3. The solar cell structural body according to claim 1, wherein the mixing ratio of said aggregate to said cement is at least 1:4 by weight.

4. The solar cell structural body according to claim 1, wherein said cement comprises a Portland cement or an alumina cement.

5. The solar cell structural body according to claim 1, wherein said concrete retaining body comprises a concrete hardened in atmospheric air.

6. The solar cell structural body according to claim 1, wherein said concrete retaining body serves as a back face member or a trestle for said solar cell.

7. The solar cell structural body according to claim 1, wherein said concrete retaining body does not contain a reinforcement.

8. The solar cell structural body according to claim 1, wherein said solar cell has two electrically conductive portions having a different polarity, one on the light receiving face side and the other on the non-light receiving face side.

9. A solar cell array having a plurality of solar cell structural bodies connected with each other in series connection, each of said plurality of solar cell structural bodies having a solar cell arranged on a concrete retaining body comprising a concrete prepared from a mixture comprising at least a cement, water and an aggregate, such that part of a conductor portion of said solar cell contacts said concrete retaining body, wherein said concrete has a resistivity in a range of from $9\times10^3$ to $120\times10^3$ $\Omega\cdot$cm, and wherein the relation equation $t>1307.9(0.71+0.016\times\theta)/(d\times g\times\cos\theta)$ is established, with d being the density of said concrete retaining body measured in Kg/m³, $\theta$ being the inclination angle of said concrete retaining body from a ground face, t being the thickness of said concrete retaining body measured in meters, and g being the acceleration of gravity measured in m/s².

10. The solar cell array according to claim 9, wherein a positive electrode terminal or a negative electrode terminal of said solar cell array is electrically grounded.

11. A sunlight power generation system having a connection body in which a plurality of solar cell structural bodies are electrically connected and said connection body has a positive electrode terminal and a negative electrode terminal which are connected to an inverter having a ground sensor accommodated therein, each of said plurality of solar cell structural bodies having a solar cell arranged on a concrete retaining body comprising a concrete prepared from a mixture comprising at least a cement, water and an aggregate, such that part of a conductor portion of said solar cell contacts said concrete retaining body, wherein said concrete has a resistivity in a range of from $9\times10^3$ to $120\times10^3$ $\Omega\cdot$cm, and wherein the relation equation $t>1307.9(0.71+0.016\times\theta)/(d\times g\times\cos\theta)$ is established, with d being the density of said concrete retaining body measured in Kg/m³, $\theta$ being the inclination angle of said concrete retaining body from a ground face, t being the thickness of said concrete retaining body measured in meters, and g being the acceleration of gravity measured in m/s².

12. The sunlight power generation system according to claim 11, wherein each of said plurality of solar cell structural bodies has a ground current $I_{leak}$ of less than 100 mA.

* * * * *

UNITED STATES PATENT AND TRADEMARK OFFICE
CERTIFICATE OF CORRECTION

PATENT NO. : 6,818,820 B2
DATED : November 16, 2004
INVENTOR(S) : Masaaki Matsushita et al.

It is certified that error appears in the above-identified patent and that said Letters Patent is hereby corrected as shown below:

Column 1,
Line 28, "In" should read -- in --.

Column 2,
Line 45, "necessitated" should be deleted.

Column 3,
Line 30, "module," should read -- module is used, --;
Line 33, "For doing in this way," should read -- As such, --;
Line 36, "to per-" should read -- to be per- --;
Line 37, "form" should read -- formed --; and
Line 38, "man-hour" should read -- man-hour demand --.

Column 4,
Line 48, "takes" should read -- take --; and
Line 51, "call" should read -- cell --.

Column 6,
Line 45, "d[Kg/m$^3$]," should read -- d[kg/m$^3$], --.

Column 9,
Line 12, "be$\rho$" should read -- be $\rho$ --;
Lines 20 and 33, "resistivity$\rho$" should read -- resistivity $\rho$ --.

Column 11,
Line 28, "d[Kg/m$^3$]" should read -- d[kg/m$^3$] --;
Line 40, "B$\theta$," should read -- $\theta$, --;
Line 46, "be$\rho$" should read -- be $\rho$ --; and
Line 52, "q×l/2×pV$^2$×α×I×J" should read -- $q = 1/2 \times \rho V^2 \times \alpha \times I \times J$ --.

Column 12,
Line 6, "(d×g×co $\theta$)" should read -- (d×g×cos $\theta$) --.

Column 13,
Line 62, "d[Kg/m$^3$]," should read -- d[kg/m$^3$], --.

Column 14,
Line 35, "and waterproof" should read -- waterproofness --.

UNITED STATES PATENT AND TRADEMARK OFFICE
CERTIFICATE OF CORRECTION

PATENT NO. : 6,818,820 B2
DATED : November 16, 2004
INVENTOR(S) : Masaaki Matsushita et al.

It is certified that error appears in the above-identified patent and that said Letters Patent is hereby corrected as shown below:

Column 16,
Line 34, "was;" should read -- was: --;
Line 35, "Ipm×4.6A." should read -- Ipm = 4.6A. --; and
Line 50, "Kg/m$^3$" should read -- kg/m$^3$ --.

Column 18,
Line 66, "is preferred to" should read -- preferably --.

Column 19,
Line 2, "preferred to perform" should read -- preferably performed --;
Line 24, "d[Kg/m$^3$]," should read -- d[kg/m$^3$], --;
Line 42, "having" should read -- has --; and
Line 65, "Kg/m$^3$," should read -- kg/m$^3$, --.

Column 20,
Lines 36 and 58, "Kg/m$^3$," should read -- kg/m$^3$, --.

Signed and Sealed this

Eighteenth Day of October, 2005

JON W. DUDAS
*Director of the United States Patent and Trademark Office*